United States Patent
Zhou (10) Patent No.: US 9,117,532 B2
(45) Date of Patent: Aug. 25, 2015

(54) APPARATUS FOR INITIALIZING PERPENDICULAR MRAM DEVICE

(71) Applicant: Avalanche Technology Inc., Fremont, CA (US)

(72) Inventor: Yuchen Zhou, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 57 days.

(21) Appl. No.: 14/219,990

(22) Filed: Mar. 19, 2014

(65) Prior Publication Data

US 2014/0204662 A1 Jul. 24, 2014

Related U.S. Application Data

(63) Continuation-in-part of application No. 13/546,169, filed on Jul. 11, 2012, now Pat. No. 8,971,100, which is a continuation-in-part of application No. 13/360,524, filed on Jan. 27, 2012, now Pat. No. 8,559,215.

(51) Int. Cl.

| | |
|---|---|
| *G11C 11/00* | (2006.01) |
| *G11C 11/15* | (2006.01) |
| *G11C 11/56* | (2006.01) |
| *G11C 13/00* | (2006.01) |

(52) U.S. Cl.
CPC ............ *G11C 11/15* (2013.01); *G11C 11/5607* (2013.01); *G11C 2013/0083* (2013.01)

(58) Field of Classification Search
CPC ........................................................ G11C 11/00
USPC ......... 365/48, 55, 62, 66, 74, 78, 80–93, 100, 365/130, 131, 148, 158, 171–173, 209, 213, 365/225.5, 230.07, 232, 243.5; 977/933–935

See application file for complete search history.

(56) References Cited

U.S. PATENT DOCUMENTS

| | | | |
|---|---|---|---|
| 6,744,086 B2 | 6/2004 | Daughton et al. | |
| 6,943,420 B2 | 9/2005 | Jeong | |
| 2005/0083747 A1* | 4/2005 | Tang et al. | ............ 365/210 |

(Continued)

OTHER PUBLICATIONS

Jasson Janesky, Impact of External Magnetic Fields on MRAM Products, Freescale Semiconductor Application Note AN3525 Rev. 0, Nov. 2007 on the Internet at http://cache.freescale.com/files/32bit/doc/app_note/AN3525.pdf.

(Continued)

*Primary Examiner* — Harry W Byrne
(74) *Attorney, Agent, or Firm* — Bing K. Yen (57) ABSTRACT

The present invention is directed to an apparatus for initializing perpendicular magnetic tunnel junction. The apparatus comprises a permanent magnet for generating a magnetic flux; a flux concentrator made of a soft ferromagnetic material and having a base area in contact with the permanent magnet and an tip area that is smaller than the base area, thereby funneling and concentrating the magnetic flux to the tip area for emitting a magnetic field therefrom; and a means for supporting and conveying a substrate with an arrays of magnetic tunnel junctions formed therein to traverse the magnetic field in close proximity to the tip area. The apparatus may further include at least one of the following: a substrate heater, a flux containment structure coupled to the permanent magnet, and a magnetic imaging plate disposed in proximity to the substrate on the opposite side from the flux concentrator.

18 Claims, 6 Drawing Sheets

(56) References Cited

U.S. PATENT DOCUMENTS

2005/0133822 A1    6/2005  DeHerrera et al.
2006/0067149 A1*   3/2006  Shimizu et al. ............... 365/210
2006/0233017 A1*  10/2006  Hosotani et al. ............. 365/158
2009/0268515 A1*  10/2009  Jeong et al. .................. 365/171
2010/0109110 A1*   5/2010  Wang et al. ................... 257/421

OTHER PUBLICATIONS

D.C. Worledge, et al.; Spin torque switching of perpendicular Ta/CoFeB/MgO-based magnetic tunnel junctions; Appl. Phys. Lett. 98, 022501 (2011); published online Jan. 10, 2011.

* cited by examiner

APPARATUS FOR INITIALIZING PERPENDICULAR MRAM DEVICE

CROSS-REFERENCE TO RELATED APPLICATIONS

The present application is a continuation-in-part of the commonly assigned application bearing Ser. No. 13/546,169 filed Jul. 11, 2012, entitled "INITIALIZATION METHOD OF A PERPENDICULAR MAGNETIC RANDOM ACCESS MEMORY (MRAM) DEVICE," currently pending; which is a continuation-in-part of the commonly assigned application bearing Ser. No. 13/360,524 filed Jan. 27, 2012, now issued as U.S. Pat. No. 8,559,215. All of these applications and the patent are incorporated herein by reference, including their specifications.

BACKGROUND

The present invention relates to an apparatus for manufacturing magnetic random access memory (MRAM) devices, and more particularly to an apparatus for orienting magnetization directions of magnetic layers in memory elements of MRAM devices.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection transistor coupled in series between appropriate electrodes. Upon application of an appropriate write current to the magnetic memory element, the electrical resistance of the magnetic memory element would change accordingly, thereby switching the stored logic in the respective memory cell.

The magnetic memory element typically includes a magnetic reference layer and a magnetic free layer with an insulating tunnel barrier or junction layer interposed therebetween, thereby collectively forming a magnetic tunneling junction (MTJ). Upon the application of an appropriate write current through the MTJ, the magnetization direction of the magnetic free layer can be switched between two directions: parallel and anti-parallel with respect to the magnetization direction of the magnetic reference layer. The insulating tunnel junction layer is normally made of a dielectric material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistivity of the MTJ. Conversely, the electrical resistivity of the MTJ is high when the magnetization directions of the magnetic reference and free layers are substantially anti-parallel. Accordingly, the stored logic in the magnetic memory element can be switched by changing the magnetization direction of the magnetic free layer.

Based on the relative orientation between the magnetic layers and the magnetization directions thereof, an MTJ can be classified into one of two types: in-plane MTJ, the magnetization directions of which lie substantially within planes parallel to the layer plane, or perpendicular MTJ, the magnetization directions of which are substantially perpendicular to the layer plane.

The magnetization directions of various magnetic layers in the MTJ, such as the magnetic reference layer and free layer, need to be initialized in proper directions in order for the MTJ memory element to function properly. For example, the magnetization directions of the magnetic free and reference layers may be oriented to be anti-parallel to each other, thereby setting the MTJ memory element to the high resistance state. For the foregoing reasons, there is a need for an apparatus that can align the magnetization directions of various magnetic layers in MTJ memory elements and that can be inexpensively manufactured.

SUMMARY

The present invention is directed to an apparatus that satisfies this need. An apparatus having features of the present invention comprises a permanent magnet for generating a magnetic flux; a flux concentrator made of a soft ferromagnetic material and having a base area in contact with the permanent magnet and an tip area that is smaller than the base area, thereby funneling and concentrating the magnetic flux to the tip area for emitting a magnetic field therefrom; and a means for supporting and conveying a substrate with an arrays of magnetic tunnel junctions formed therein to traverse the magnetic field in close proximity to the tip area. The apparatus may further include at least one of the following: a substrate heater, a flux containment structure coupled to the permanent magnet, and a magnetic imaging plate disposed in proximity to the substrate on the opposite side from the flux concentrator.

According to another aspect of the present invention as applied to an apparatus for initializing perpendicular magnetic tunnel junctions, the apparatus comprises a first permanent magnet coupled to a first flux containment structure and a first flux concentrator with the first flux concentrator having a first base area in contact with the first permanent magnet and a first tip area that is smaller than the first base area; a second permanent magnet coupled to a second flux containment structure and a second flux concentrator with the second flux concentrator having a second base area in contact with the second permanent magnet and a second tip area that is smaller than the second base area; and a means for supporting and conveying a substrate to traverse a magnetic field formed between the first and second tip areas, which are spaced apart and face each other with opposite magnetic polarities.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Figure 1:
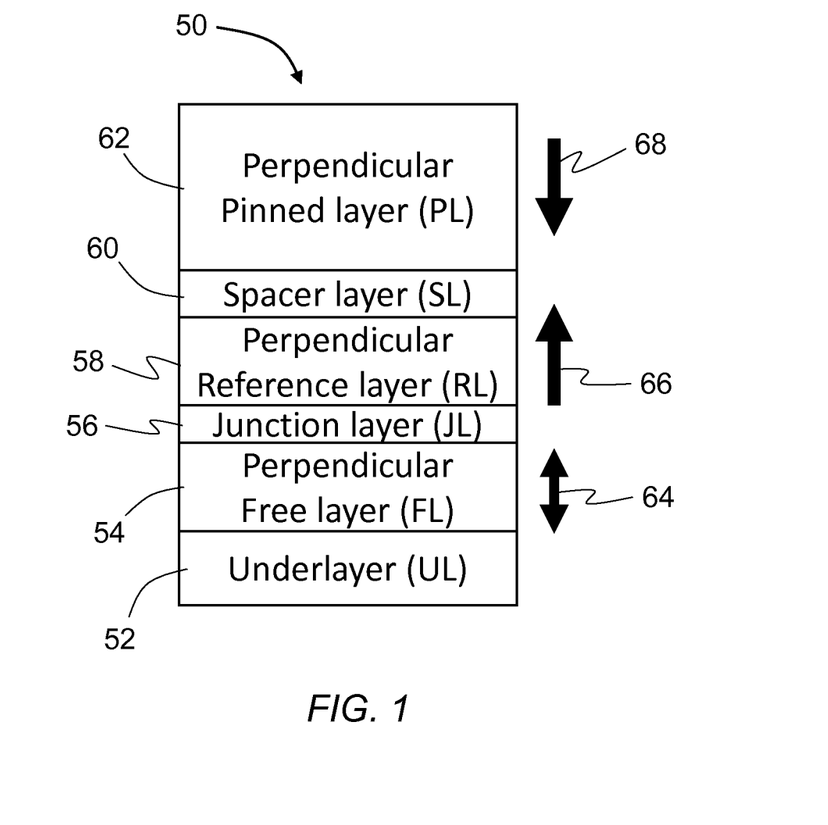
FIG. 1 is a cross sectional view of an STT-MRAM element with an exemplary perpendicular MTJ structure that may be initialized by an apparatus of the present invention.

FIG. 1 illustrates an STT-MRAM MTJ element with an exemplary perpendicular MTJ structure 50, which may be used with the present invention. The perpendicular MTJ structure 50 comprises a non-magnetic underlayer 52, a magnetic free layer 54, an insulating tunnel junction layer 56, a magnetic reference layer 58, a non-magnetic spacer layer 60, and a magnetic pinned layer 62 in sequential contact. Unlike the magnetic reference layer 58, the magnetic pinned layer 62 does not spin-polarize a current that passes therethrough. One of the functions of the magnetic pinned layer 62 is to cancel, as much as possible, the external magnetic field exerted on the magnetic free layer 54 by the magnetic reference layer 58. The magnetic pinned layer 62 also provides anti-ferromagnetic coupling to the magnetic reference layer 58 by pinning the magnetization direction 66 of the magnetic reference layer 58 in anti-parallel orientation relative to the magnetization direction 68 of the pinned layer 62 through the non-magnetic spacer layer 60, which may function as an anti-ferromagnetic exchange coupling layer made of a material comprising at least one element selected from the group consisting of ruthenium, rhodium, iridium, tantalum, manganese, oxygen, and nitrogen. All magnetic layers 54, 58, and 62 have magnetization directions that are substantially perpendicular to the respective layer planes. The magnetic free layer 54 has a variable or switchable magnetization direction 64, while the magnetic reference layer 58 and the magnetic pinned layer 62 have fixed magnetization directions 66 and 68 that are opposite to each other. The fixed magnetization directions 66 and 68 are oriented to the respective orientations during the manufacturing process.

Figure 2A:
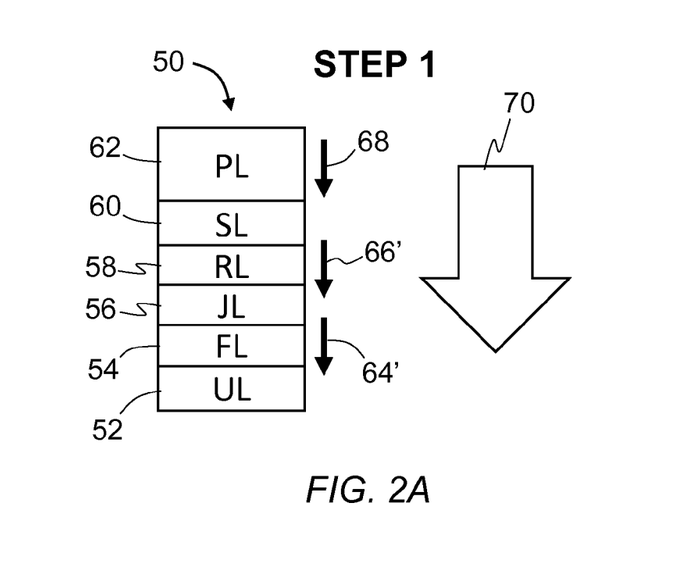
FIGS. 2A-2C illustrates progressive stages in initializing the exemplary perpendicular MTJ structure of FIG. 1.
Figure 2B:
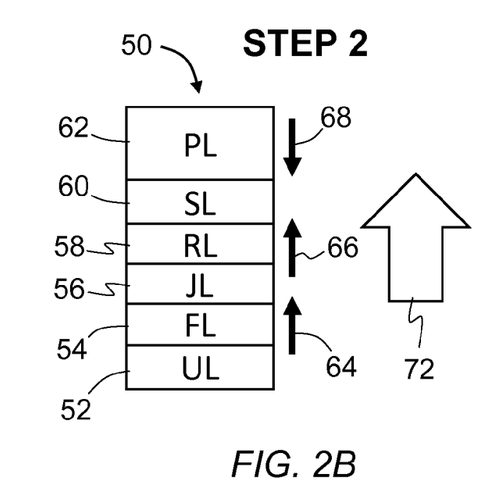
Figure 2C:
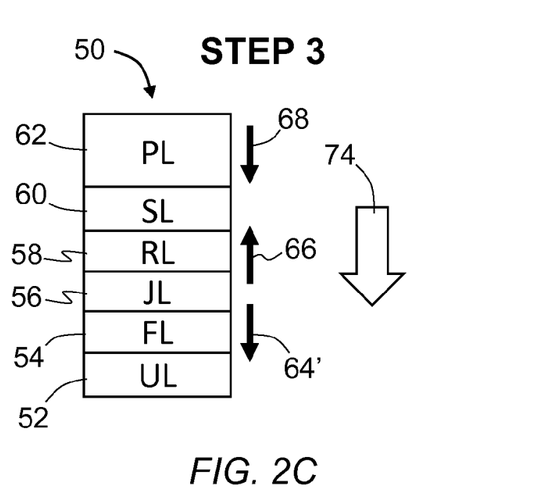

FIGS. 2A-2C illustrate progressive stages of magnetization configuration of the MTJ structure 50 with three magnetic layers 54, 58, and 62 during an initialization process. Referring to FIG. 2A, the process begins by applying a first magnetic field 70 sufficiently strong to align the magnetization directions 64', 66', and 68 of the magnetic layers 54, 58, and 62 in a predetermined direction that is parallel to the intended magnetization direction of the magnetic layer with the highest coercivity. For the MTJ structure 50, the magnetic pinned layer 62 has the highest coercivity. Therefore, the first magnetic field 70 aligns the magnetization direction 68 of the magnetic pinned layer 62 downward according to the intended magnetization configuration illustrated in FIG. 1. During the process of aligning the magnetic pinned layer 62 with the highest coercivity, the magnetization directions 64' and 66' of the rest of the magnetic layers 54 and 58 with lower coercivities are aligned downward as well. The first magnetic field 70 is removed after all magnetization directions 64', 66', and 68 are aligned in the downward direction.

Referring to FIG. 2B, a second magnetic field 72 with a weaker strength and an opposite direction compared with the first magnetic field 70 is then applied to the MTJ structure 50 to align the magnetization direction of a magnetic layer that has the highest coercivity among all magnetic layers that have the opposite intended magnetization direction as the first applied magnetic field 70. The strength of the second magnetic field 72 should be sufficiently strong to align the magnetization direction of the target layer without disturbing or realigning the magnetization directions of the magnetic layers with higher coercivities. For the MTJ structure 50, the magnetic reference layer 58 has the highest coercivity among layers that have the opposite magnetization direction compared with the magnetic pinned layer 62. Accordingly, the magnetization direction 66 of the magnetic reference layer 58 is aligned upward by the second magnetic field 72. The magnetization direction 64 of the magnetic free layer 54, which has a lower coercivity than the magnetic reference layer 58, is also aligned upward by the second magnetic field 72 as illustrated in FIG. 2B, thereby rendering the MTJ structure 50 in the low resistance state. In the case where the non-magnetic spacer layer 60 is made of an anti-ferromagnetic exchange coupling material which exerts an exchange coupling field between the magnetic pinned layer 62 and reference layer 58, the magnetization direction 66 of the magnetic reference layer 58 may automatically switch to the anti-parallel orientation relative to the magnetization direction 68 of the magnetic pinned layer 62 without the second magnetic field 72 when the anti-ferromagnetic exchange coupling field exceeds the coercivity of the reference layer 58 and is weaker than the coercivity of the magnetic pinned layer 62. In this case, the second step as illustrated in FIG. 2B can be skipped.

In addition to aligning the magnetic layers 58 and 62 having the fixed magnetization directions 66 and 68 during normal operation, the present method may optionally include the step of initializing or switching the magnetization direction 64' of the magnetic free layer 54 by a third magnetic field 74 to the anti-parallel configuration relative to the magnetization direction 66 of the magnetic reference layer 58 as illustrated in FIG. 2C, thereby switching the resistance state of the MTJ structure 50 from low to high. The strength of the third magnetic field 74 should be sufficiently high to switch the magnetization direction 64' of the magnetic free layer 54 without disturbing the magnetization direction 66 of the magnetic reference layer 58 with an opposite magnetization orientation.

The above described method of aligning magnetization directions of individual magnetic layers in the exemplary MTJ structure 50 by systematically applying external magnetic fields with decreasing strength and alternating directions can be equally applied to other types of perpendicular MTJ structures having different layer configurations and/or different number of magnetic layers.

Figure 3:
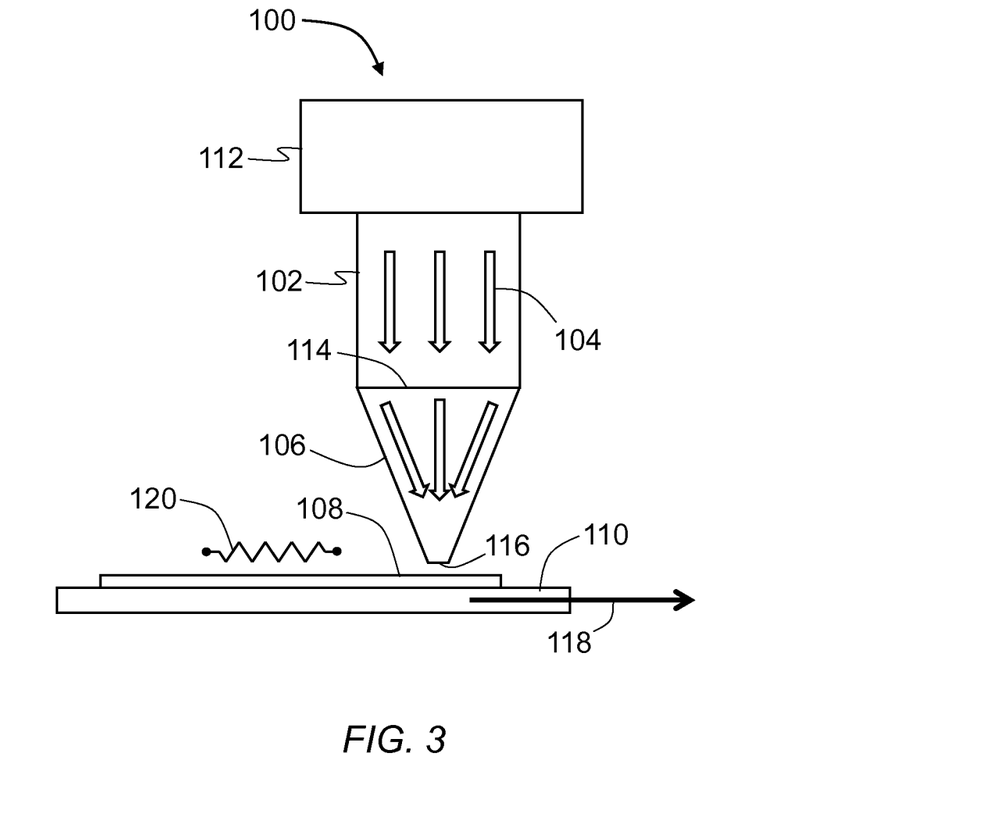
FIG. 3 is a schematic view of an apparatus for initializing perpendicular MTJ memory elements in accordance with an embodiment of the present invention.

An embodiment of the present invention as applied to an apparatus for initializing an array of perpendicular MTJ memory elements by aligning magnetization directions of individual magnetic layers thereof will now be described with reference to FIG. 3. Referring now to FIG. 3, the illustrated apparatus 100 comprises a permanent magnet 102 for generating a magnetic flux 104, a flux concentrator 106 with a tapered shape coupled to the permanent magnet 102 for funneling and concentrating the magnetic flux 104 to generate a high strength magnetic field for aligning an array of MTJ memory elements formed in a substrate 108, and a conveying system 110 for moving the array of MTJ memory elements formed in the substrate 108 to traverse the magnetic field. The apparatus 100 may optionally include a flux containment structure 112 coupled to the permanent magnet 102 for conducting back side flux thereof to further enhance the magnetic field.

The permanent magnet 102 for generating the magnetic flux 104 may be made of a suitable hard magnetic material, such as but not limited to samarium-cobalt ($SmCo_5$) or neodymium-iron-boron ($Nd_2Fe_{14}B$), and may have at least two surfaces for coupling to the flux concentrator 106 and the optional flux containment structure 112. The two surfaces may be substantially opposite to each other.

The flux concentrator 106 has a base area 114 coupled to the permanent magnet 102 and a tip area 116 that is smaller than the base area 114, resulting in a tapered shape for funneling and concentrating the magnetic flux 104 to the tip area 116 for emitting a high strength magnetic field therefrom. The magnetic field emitted from the tip area 116 should be sufficiently strong to align or switch the magnetization direction of at least one magnetic layer of the perpendicular MTJ memory elements formed in the substrate 108. The flux concentrator 106 may be made of cobalt-iron or any suitable soft magnetic material comprising at least one metal selected from the group consisting of cobalt, iron, and nickel.

The optional flux containment structure 112 coupled to the permanent magnet 102 conduct back side magnetic flux thereof to further enhance the magnetic field exerted upon the perpendicular MTJ memory elements formed in the substrate 108. The optional flux containment structure 112 may be made of any suitable soft magnetic material and is preferably made of a soft magnetic material that has a substantially similar composition as that of the flux concentrator 106.

In one embodiment, the optional flux containment structure 112 and the flux concentrator 106 are coupled to the permanent magnet 102 at opposite ends thereof. The dimensions of the permanent magnet 102, the flux concentrator 106, and the optional flux containment structure 112 in the direction perpendicular to the plane of the figure should be wide enough to accommodate the substrate 108. The apparatus 100 may optionally include an actuation mechanism (not shown) to move the assembly of the permanent magnet 102, the flux concentrator 106, and the optional flux containment structure 112 in a direction substantially perpendicular to the plane of the substrate 108 in order to adjust the strength of the magnetic field exerted upon the memory elements formed in the substrate 108. The field strength of the magnetic field exerted upon the memory elements, particularly in the direction perpendicular to the substrate surface, is governed by the tapered shape of the flux concentrator 106 and the relative distance between the tip area 116 of the flux concentrator 106 and the substrate surface.

The function of the conveying system 110 is to support and continuously move the substrate 108 and the array of perpendicular MTJ memory elements formed therein in close proximity to the tip area 116 of the flux concentrator 106, thereby exposing the memory elements to the magnetic field emanating from the tip area 116. The substrate 108, which is supported by the conveying system 110 therebeneath, may be in the form of a whole wafer or a die diced from a wafer. The conveying system 110 may use any suitable means to support and continuously move the substrate 108, such as but not limited to carrier, conveyor, or transfer fork of a robot. In one embodiment, the conveying system 110 moves the substrate 108 along a direction 118 substantially perpendicular to the magnetic field emitted from the tip area 116 of the flux concentrator 106.

The apparatus 100 may further include a heater 120 for heating the substrate 108 during or before traversing the magnetic field in proximity to the tip area 116 of the flux concentrator 106. The heater 120 can be mounted above or beneath the substrate 108. The coercivity of a ferromagnetic material decreases with temperature up to the Curie temperature, above which the ferromagnetic material becomes paramagnetic. Therefore, heating the substrate 108 to an elevated temperature would advantageously lower the magnetic field strength required for aligning or switching magnetization directions of magnetic layers in the perpendicular MTJ memory elements formed in the substrate 108. The heater 120 may be a resistance heater, a lamp heater, a laser heater, or any suitable type of heater for heating the substrate 108. The conveying system 110 may also incorporate therein a heating element (not shown) to directly heat the substrate 108 placed thereon.

The magnetic field emanating from the tip area 116 of the flux concentrator 106 may be measured by placing a magnetic field sensor (not shown), such as a Hall effect sensor, near the tip area 116. The magnetic field sensor may be located in close proximity to the substrate 108 on the opposite side from the tip area 116. The magnetic field sensor remains stationary relative to the tip area 116 during normal operation.

Operation of the illustrated apparatus 100 of FIG. 3 will now be described according to an embodiment of the present invention. The magnetic field strength as exerted upon the memory elements formed in the substrate 108 is first set to a desired level by adjusting the relative distance between the tip area 116 and the surface of the substrate 108. The magnetic field strength increases with decreasing relative distance and vice versa. After the relative distance between the tip area 116 and the substrate surface is set, the substrate 108 and the array of perpendicular MTJ memory elements formed therein are conveyed to traverse the magnetic field in close proximity to the tip area 116 by the conveying system 110, thereby aligning or switching the magnetization direction of at least one magnetic layer in the memory elements.

Figure 4:
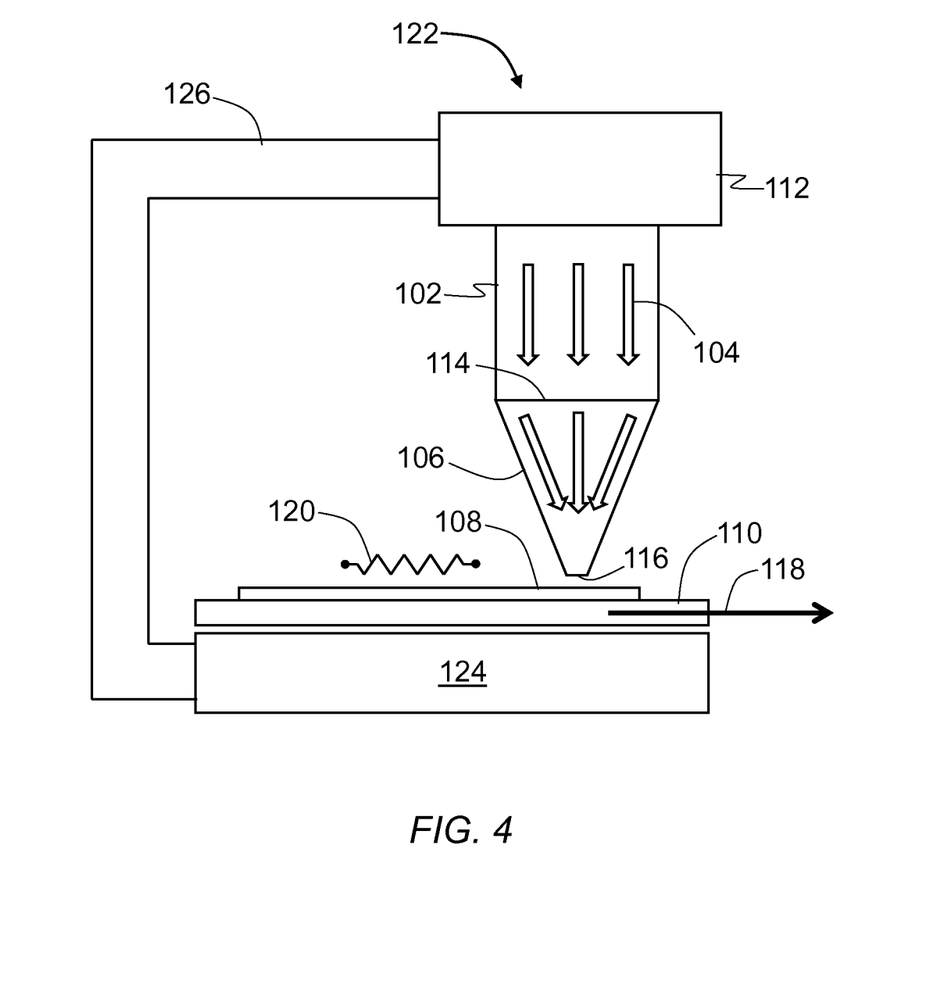
FIG. 4 is a schematic view of an apparatus utilizing a magnetic imaging layer for initializing perpendicular MTJ memory elements in accordance with another embodiment of the present invention.

Another embodiment of the present invention as applied to an apparatus for initializing an array of perpendicular MTJ memory elements is illustrated in FIG. 4. In the drawing, numerals 102 to 120 denote the same components or substances as those shown for the embodiment of FIG. 3. The apparatus 122 of FIG. 4 is different from the apparatus 100 of FIG. 3 in that a magnetic imaging plate 124 is disposed near the substrate 108 opposite to the tip area 116. In one embodiment, the magnetic imaging plate 124 is disposed in close proximity to the conveying system 110 on the opposite side from the tip area 116. The magnetic imaging plate 124 is used for magnetic imaging by the tip area 116 of the flux concentrator 106 for enhancing the local magnetic field in the proximity of the substrate 108. The magnetic imaging plate 124 remains stationary relative to the flux concentrator 106 during normal operation. The magnetic imaging plate 124 may be made of any suitable soft magnetic material and is preferably made of a soft magnetic material that has a substantially similar composition as that of the flux concentrator 106. In another embodiment, the flux concentrator 106, the optional flux containment structure 112, and the magnetic imaging plate 124 are made of similar soft ferromagnetic materials comprising at least one metal selected from the group consisting of cobalt, nickel, and iron.

The apparatus 122 of FIG. 4 may optionally include a flux closure structure 126 made of a soft ferromagnetic material and directly coupled to the optional flux containment structure 112 and the magnetic imaging plate 124 at the two ends thereof. The flux closure structure 126 serves as a direct magnetic flux closure path between the flux containment structure 112 and the magnetic imaging plate 124 to reduce flux leakage and further enhance the local magnetic field in the proximity of the substrate 108.

Figure 5:
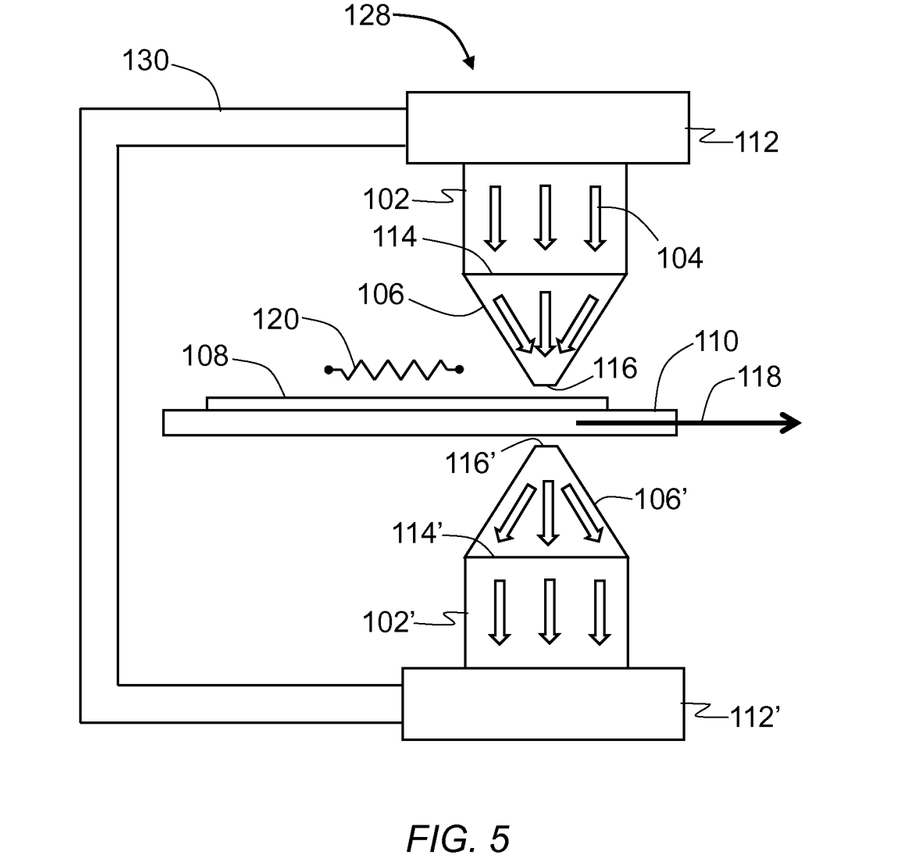
FIG. 5 is a schematic view of an apparatus incorporating dual permanent magnets and dual flux concentrators for initializing perpendicular MTJ memory elements in accordance with still another embodiment of the present invention.

Yet another embodiment of the present invention as applied to an apparatus for initializing an array of perpendicular MTJ memory elements is illustrated in FIG. 5. In the drawing, numerals 102 to 120 denote the same components or substances as those shown for the embodiments of FIGS. 3 and 4. The apparatus 128 of FIG. 5 is different from the apparatus 122 of FIG. 4 in that the magnetic imaging plate 124 of the apparatus 122 is replaced by an assembly comprising a second permanent magnet 102' coupled to a second flux concentrator 106' and an optional second flux containment structure 112', which is similar to the assembly of the permanent magnet 102 coupled to the flux concentrator 106 and the optional flux containment structure 112 but with a reverse orientation such that the tips areas 116 and 116' of the flux concentrators 106 and 106' face each other. The first and second tip areas 116 and 116' have opposite magnetic polarities and are spaced apart to form therebetween a magnetic field for aligning or switching an array of perpendicular MTJ memory elements formed in the substrate 108 passing therebetween.

The permanent magnets 102 and 102' have magnetization directions that render the first and second tip areas 116 and 116' to have opposite magnetic polarities, allowing the synergistic effect of dual magnets for generating magnetic flux and dual concentrators for focusing the flux to further enhance the magnetic field compared with the embodiments of FIGS. 3 and 4. The magnetic field for switching or aligning perpendicular MTJ memory elements formed in the substrate 108 can be controlled by adjusting the relative distance between the tip areas 116 and 116' and/or the relative distance between the tip area 116 and the wafer surface. The field strength decreases with increasing relative distance between the tip areas 116 and 116' or relative distance between the tip area 116 and the wafer surface. The magnetic field may also be controlled by the tapered shapes of the flux concentrators 106 and 106'.

The second permanent magnet 102' may have the substantially same magnetization direction as the permanent magnet 102 and may be made of a suitable hard magnetic material, such as but not limited to samarium-cobalt ($SmCo_5$) or neodymium-iron-boron ($Nd_2Fe_{14}B$). The permanent magnets 102 and 102' may be made of similar hard magnetic materials. The second permanent magnet 102' may have at least two surfaces for coupling to the second flux concentrator 106' and the optional second flux containment structure 112'. The two surfaces may be substantially opposite to each other.

The second flux concentrator 106' has a base area 114' coupled to the second permanent magnet 102' and the tip area 116' that is smaller than the base area 114', resulting in a tapered shape for flux focusing. The second flux concentrator 106' may be made of a cobalt-iron alloy or any suitable soft magnetic material comprising at least one metal selected from the group consisting of cobalt, iron, and nickel. The flux concentrators 106 and 106' may be made of similar soft magnetic materials.

The optional second flux containment structure 112' coupled to the second permanent magnet 102' conduct back side magnetic flux thereof. The optional second flux containment structure 112' may be made of any suitable soft magnetic material and is preferably made of a similar material as that of the second flux concentrator 106'.

The apparatus 128 of FIG. 5 may optionally include a flux closure structure 130 made of a soft ferromagnetic material and directly coupled to the optional flux containment structures 112 and 112' at the two ends thereof. The flux closure structure 130 serves as a direct magnetic flux closure path between the optional flux containment structures 112 and 112' to reduce flux leakage and further enhance the local magnetic field in the proximity of the substrate 108.

In one embodiment, the flux concentrators 106 and 106', the optional flux containment structures 112 and 112', and the optional flux closure structure 130 are made of similar soft magnetic materials, which comprise at least one metal selected from the group consisting of cobalt, iron, and nickel.

Figure 6A:
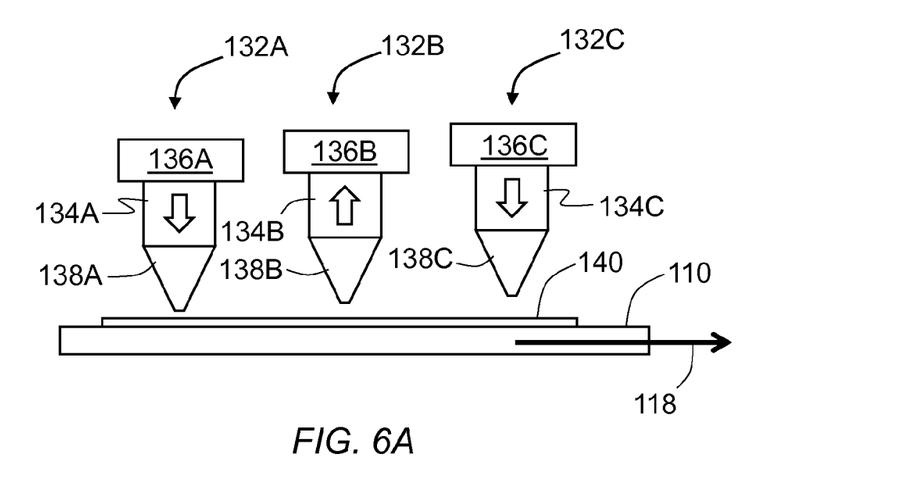
FIG. 6A is a schematic view of an apparatus incorporating three magnetizing units for initializing the exemplary perpendicular MTJ structure of FIG. 1 in accordance with the present invention.

The present invention may be used to initialize any perpendicular MTJ memory elements, including elements with the exemplary MTJ structure 50 shown in FIG. 1, in accordance with the above-described method as illustrated in FIG. 2. FIG. 6A shows an apparatus comprising a first 132A, a second 132B, and a third 132C magnetizing units for aligning the magnetization directions 64-68 of the three magnetic layers 54, 58, and 62 of the perpendicular MTJ structure 50. Each of the three magnetizing units 132A-132C has a respective permanent magnet 134A, 134B, or 134C coupled to a respective flux containment structure 136A, 136B, or 136C and a respective flux concentrator 138A, 138B, or 138C, the tip area of which emits a magnetic field for aligning at least one of the magnetization directions 64-68 of the perpendicular MTJ structure 50 formed in a substrate 140. The conveying system 110 support and move the substrate 140 in close proximity to the tip areas of the magnetic concentrators 138A-138C to traverse the magnetic fields generated by the magnetizing units 132A-132C.

The strength of the magnetic field exerted on the substrate surface by each of the magnetizing units 132A-132C may be controlled by adjusting the relative distance between the respective tip area and the substrate surface, the remanent magnetization or the size of the respective permanent magnets 134A, 134B, or 134C, or the tapering shape of the respective flux concentrator 138A, 138B, or 138C. In one embodiment in which the magnetizing units 132A-132C of FIG. 6A are substantially identical, the field strength is then mainly controlled by the relative distance between the tip area and the substrate surface. The tip areas of the first and third magnetizing units 132A and 132C, which have a downward magnetization direction, are closest and farthest to the substrate surface, respectively. The relative distance between the substrate and the tip area of the second magnetizing unit 132B, which has an upward magnetization direction, is intermediate. Therefore, the first 132A and third 132C magnetizing units have the strongest and weakest fields, respectively, while the second magnetizing unit 132B has an opposite magnetization direction compared with the first 132A and third 132C magnetizing units.

Figure 6B:
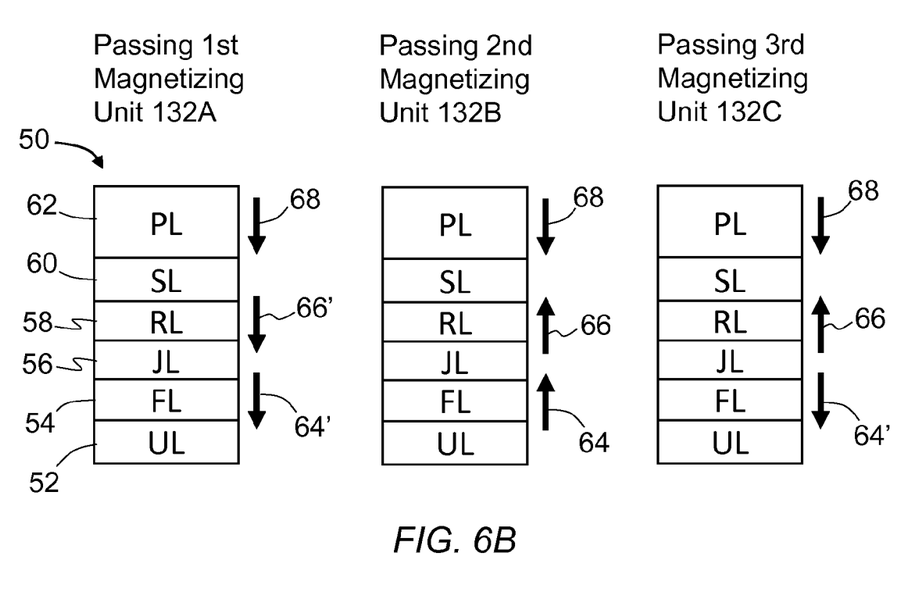
FIG. 6B illustrates magnetization configurations of the exemplary perpendicular MTJ structure of FIG. 1 during initialization process by the apparatus of FIG. 6A.

FIG. 6B illustrates progressive stages of magnetization of the perpendicular MTJ structure 50 after passing through each of the magnetizing units 132A-132C shown in FIG. 6A. In the drawing, numerals 50 to 68 denote the same components or substances as those shown in FIG. 2. After passing the first magnetizing unit 132A, the magnetization directions 64', 66', and 68 of the magnetic layers 54, 58, and 62 are oriented downward, which is consistent with that of the first magnetizing unit 132A. The magnetic field exerted by the first magnetizing unit 132A is strong enough to align the magnetization directions 64', 66', and 68 of the magnetic layers 54, 58, and 62 downward. After passing the second magnetizing unit 132B, which exerts a weaker field with opposite orientation compared with that of the first magnetizing unit 132A, the magnetization directions 64 and 66 of the magnetic free layer 54 and the magnetic reference layer 58 are aligned upward, while the magnetization direction 68 of the magnetic pinned layer 62 has the same downward orientation. The magnetic field exerted by the second magnetizing unit 132B is adjusted to be strong enough to align the magnetization directions 64 and 66 of the magnetic free 54 and reference 58 layers without perturbing the magnetization direction 68 of the magnetic pinned layer 62, which has the highest coercivity among the three magnetic layers 54, 58, and 62. After passing the third magnetizing unit 132C, which exerts the weakest field with the downward orientation, the magnetization direction 64' of the magnetic free layer 54 is aligned downward, while the magnetization directions 66 and 68 of the magnetic reference 58 and pinned 62 layers remain the same. The magnetic field exerted by the third magnetizing unit 132C is adjusted to be strong enough to align the magnetization directions 64' of the magnetic free 54 layer, which has the lowest coercivity, without perturbing the magnetization directions 66 and 68 of the magnetic reference 58 and pinned 62 layers.

The present invention provides a low cost and fast throughput apparatus suitable for initializing perpendicular MTJ memory elements formed on wafers or individual dies in an automated manufacturing environment. Comparing to any equipment that utilizes electromagnets, the use of permanent magnets allows the present invention to be more energy and cost efficient and have a smaller footprint. The present invention also has a low flux leakage, especially with the flux closure structure, that could interfere with surrounding equipment.

The previously described embodiments of the present invention have many advantages, including energy efficient, low cost, and low flux leakage. It is important to note, however, that the invention does not require that all the advantageous features and all the advantages need to be incorporated into every embodiment of the present invention.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. An apparatus for initializing perpendicular magnetic tunnel junctions, the apparatus comprising:
    a permanent magnet;
    a flux concentrator made of a soft ferromagnetic material and having a base area in contact with said permanent magnet and an tip area that is smaller than said base area, thereby funneling and concentrating a magnetic flux generated by said permanent magnet to form a magnetic field at said tip area; and
    a means for supporting and conveying a substrate to traverse said magnetic field in close proximity to said tip area.

2. The apparatus of claim 1, wherein said soft ferromagnetic material comprises at least one metal selected from the group consisting of cobalt, nickel, and iron.

3. The apparatus of claim 1, further comprising a means for adjusting relative distance between said tip area and a surface of said substrate.

4. The apparatus of claim 1, further comprising a substrate heater.

5. The apparatus of claim 1, further comprising a flux containment structure made of a soft ferromagnetic material and coupled to said permanent magnet.

6. The apparatus of claim 1, further comprising a magnetic imaging layer made of a soft ferromagnetic material disposed in proximity to said means for supporting and conveying said substrate opposite said flux concentrator.

7. The apparatus of claim 1, further comprising a magnetic imaging layer made of a soft ferromagnetic material disposed in proximity to said substrate opposite said flux concentrator.

8. The apparatus of claim 5, further comprising a magnetic imaging layer made of a soft ferromagnetic material in proximity to said substrate opposite said flux concentrator.

9. The apparatus of claim 8, wherein each of said flux concentrator, said magnetic imaging layer, and said flux containment structure is made of a soft ferromagnetic material comprising at least one metal selected from the group consisting of cobalt, nickel, and iron.

10. The apparatus of claim 8, further comprising a flux closure structure coupled to said magnetic imaging layer and said flux containment structure.

11. The apparatus of claim 10, wherein said flux closure structure is made of a soft ferromagnetic material comprising at least one metal selected from the group consisting of cobalt, nickel, and iron.

12. An apparatus for initializing perpendicular magnetic tunnel junctions, the apparatus comprising:
    a first permanent magnet;
    a first flux concentrator having a first base area in contact with said first permanent magnet and a first tip area that is smaller than said first base area;
    a second permanent magnet;
    a second flux concentrator having a second base area in contact with said second permanent magnet and a second tip area that is smaller than said second base area, said first and second tip areas being spaced apart and facing each other with a magnetic field formed therebetween; and
    a means for supporting and conveying a substrate to traverse said magnetic field.

13. The apparatus of claim 12, wherein said first and second tip areas have opposite magnetic polarities.

14. The apparatus of claim 12, further comprising a substrate heater.

15. The apparatus of claim 12, further comprising a first flux containment structure coupled to said first permanent magnet and a second flux containment structure coupled to said second permanent magnet.

16. The apparatus of claim 15, wherein each of said first and second flux concentrators and said first and second flux containment structures is made of a soft ferromagnetic material.

17. The apparatus of claim 15, further comprising a flux closure structure coupled to said first and second flux containment structures.

18. The apparatus of claim 17, wherein said flux closure structure is made of a soft ferromagnetic material comprising at least one metal selected from the group consisting of cobalt, nickel, and iron.

* * * * *